United States Patent [19]

Desai

[11] 4,031,319

[45] June 21, 1977

[54] SINGLE CONTROL POWER-FREQUENCY CONTROL CIRCUIT

[75] Inventor: Samir Thakorbhai Desai, Roselle, Ill.

[73] Assignee: Motorola, Inc., Schaumburg, Ill.

[22] Filed: Dec. 12, 1975

[21] Appl. No.: 640,368

[52] U.S. Cl. .............................. 179/1 D; 179/1 VL
[51] Int. Cl.$^2$ ........................................ H04R 3/00
[58] Field of Search ............. 179/1 D, 1 G, 1 VL,
179/100.1 TC; 325/424; 333/28 T

[56] References Cited

UNITED STATES PATENTS

| | | | |
|---|---|---|---|
| 1,914,629 | 6/1933 | Aguirre | 179/1 D |
| 2,133,816 | 10/1938 | Holst | 325/424 |
| 3,452,282 | 6/1969 | Beres | 179/1 D |
| 3,487,341 | 12/1969 | Grout | 179/1 D |
| 3,755,626 | 8/1973 | Lace | 179/1 D |

Primary Examiner—Douglas W. Olms

Attorney, Agent, or Firm—Phillip M. Melamed; James W. Gillman

[57] ABSTRACT

A single mechanically adjustable power-frequency control circuit is disclosed which is especially adaptable for use in controlling an audio electrical signal in an automotive entertainment device such as a radio or a tape player. The circuit comprises a parallel resistor and capacitor which are coupled between the wiper arm of a volume potentiometer and one end of the potentiometer by a power boost slide switch. Actuation of the switch couples the resistor and capacitor in parallel with a portion of the volume potentiometer resistance and thereby selectively emphasizes certain portions of the entire audio frequency spectrum of an audio output signal while simultaneously substantially changing the magnitude of the output signal throughout the entire audio frequency range.

14 Claims, 4 Drawing Figures

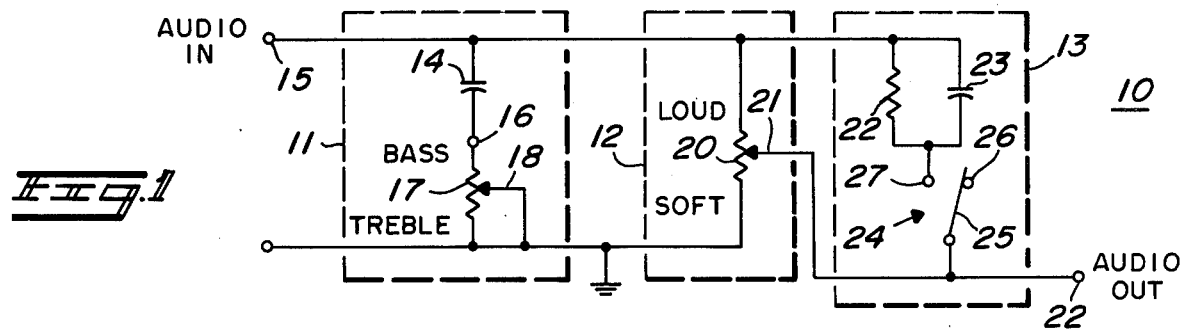
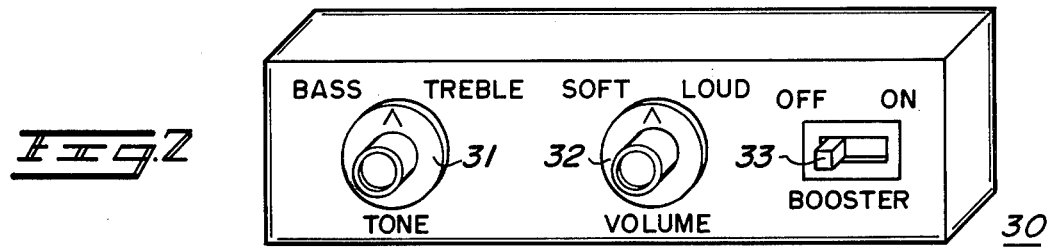
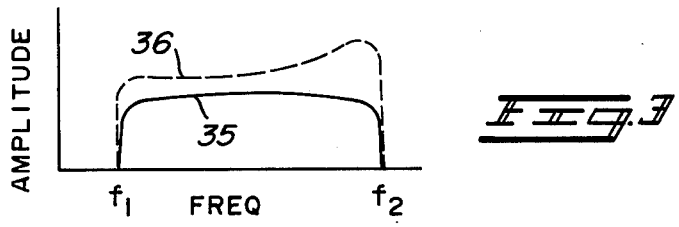
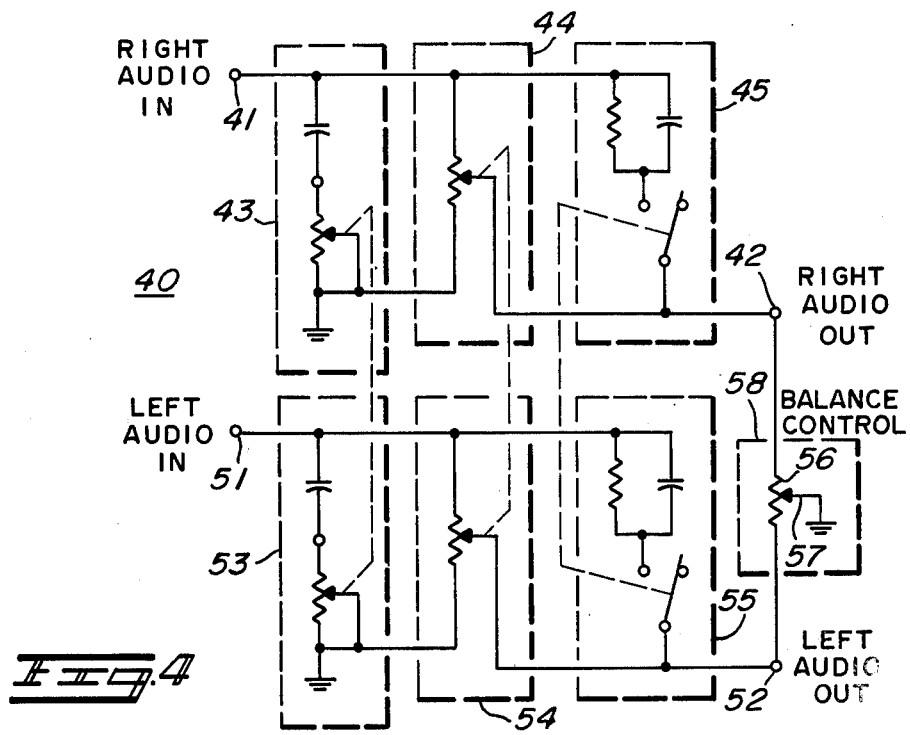

SINGLE CONTROL POWER-FREQUENCY CONTROL CIRCUIT

BACKGROUND OF THE INVENTION

The invention relates generally to the field of tone and volume control circuits for audio frequency entertainment devices and more particularly to an improved single control power-frequency circuit which is especially adaptable for use in controlling an audio electrical signal in automotive radios and tape players.

In entertainment devices, such as radios and tape players, it is desirable to provide a minimum number of tuning controls which enable the operator to simply adjust the device to obtain a desired mode of operation.

Separate tuning controls for controlling the volume and tone quality of audio signals are usually provided. These controls generally comprise continuously variable potentiometers which function independently of one another. In addition, many entertainment devices provide an additional control for emphasizing either the high or low ends of the frequency spectrum of the resultant audio signal produced by the entertainment device. This additional control is commonly referred to as a "booster" circuit. These booster circuits provide for the selective emphasizing of certain frequency ranges of the audio signal while maintaining the magnitude of the audio signal substantially constant in the unemphasized frequency ranges. To accomplish this frequency boost, prior art circuits use complex and costly tuning circuits, many of which use expensive multitaped potentiometers.

These prior art booster circuits ignore the fact that the reason a booster circuit is actuated by the operator of an entertainment device is to increase the dynamic brilliance of the sound coming from the device. Thus in practice, the operator of a radio first actuates his prior art booster circuit and then adjusts the volume control of the radio to obtain a larger magnitude audio signal throughout the entire audio frequency range. These separate tuning operations produce the dynamic brilliance of the audio sound which the operator desires. Prior art circuits go to extreme lengths to prevent any overall increase in the audio level whenever a frequency booster circuit is actuated. Thus two tuning operations are always required.

Such additional tuning operations are particularly annoying to the operator of a motor vehicle who is trying to adjust the tuning of his car radio while driving. An operator of a motor vehicle requires simplified tuning controls which will rapidly enable him to obtain a desired mode of operation from the audio frequency entertainment devices located within his motor vehicle. This requirement is primarily responsible for the development of pushbutton automobile radios. However automotive tone control devices have not recognized the fact that when the operator desires to emphasize either the base or treble ranges of his audio frequency device, he invariably also desires an overall increase in the loudness of the audio signal throughout the entire audio frequency range.

SUMMARY OF THE INVENTION

An object of the present invention is to provide an improved and simplified control circuit especially adaptable for use in controlling an audio electrical signal.

A more particular object of the invention is to provide such an improved single control circuit especially adaptable for use in an audio automotive entertainment device.

In one embodiment of the present invention there is provided an improved single control power-frequency control circuit comprising: a first terminal for receiving an audio input signal throughout an audio frequency range, a second terminal, and an adjustable control means coupled between the first and second terminals for receiving the audio signal and providing a modified audio signal at the second terminal, the control means providing a single adjustment for selectively emphasizing certain frequencies within an audio frequency range in the modified audio signal while simultaneously substantially adjusting the magnitude of the modified audio signal throughout the audio frequency range.

The preferred embodiment of the present invention basically comprises a mechanically adjustable tone control apparatus, a mechanically adjustable volume control apparatus and a mechanically adjustable audio boost circuit. The tone control and volume control both comprise separate potentiometers and the audio boost circuit comprises a switch and a parallel resistor-capacitor combination coupled between the wiper arm and an end terminal of the volume control potentiometer. Thus the actuation of the booster circuit switch changes the effective resistive setting of the volume potentiometer by coupling a resistor in parallel with a portion of this potentiometer while simultaneously emphasizing certain audio frequencies by coupling a capacitor in parallel with a portion of the same potentiometer. Therefore a simplified volume and tone control has been provided which simultaneously emphasizes certain audio frequencies while substantially changing the magnitude of an audio signal throughout its entire audio frequency range.

BRIEF DESCRIPTION OF THE DRAWINGS

For a more complete understanding of the invention reference should be made to the drawings, in which:

FIG. 1 is a schematic diagram of an improved single control power-frequency control circuit constructed according to the present invention;

FIG. 2 is a perspective view of the external mechanical controls of an entertainment device which uses the control circuit illustrated in FIG. 1;

FIG. 3 is a graph illustrating the frequency versus amplitude characteristics of an audio signal; and FIG. 4 is a schematic diagram of another power-frequency control circuit in which the circuit in FIG. 1 is adapted for use in a stereo entertainment device.

DESCRIPTION OF THE PREFERRED EMBODIMENT

FIG. 1 illustrates a volume and tone control circuit 10 especially adaptable for use in controlling an audio electrical signal in an automotive entertainment device. The circuit basically comprises a tone control circuit 11 coupled to a volume control circuit 12 which is coupled to an audio boost circuit 13, each of these circuits being illustrated within dashed rectangles.

The tone control circuit 11 comprises a capacitor 14 coupled between an audio input terminal 15 and an internal terminal 16. Terminal 16 is coupled to ground through the resistive element of a potentiometer 17 which has an adjustable wiper arm 18 that is directly connected to ground. The capacitor 14 and the potentiometer 17 basically comprise the tone control circuit 11 which primarily functions as a variable treble frequency attenuator. As the wiper arm 18 is moved towards the terminal 16, additional treble frequency attenuation is obtained thus effectively emphasizing the base frequency portions of any audio signal present at the input terminal 15. Similarly, the movement of the wiper arm 18 away from the terminal 16 will effectively provide a larger resistance between this terminal and ground and thereby decrease the amount of treble frequency attenuation which effectively results in the emphasizing of the treble frequencies of an audio signal at terminal 15.

The volume control circuit 12 comprises a potentiometer 20 having a resistive element coupled between the input terminal 15 and ground and an adjustable wiper arm 21 directly coupled to an audio output terminal 22. Thus the volume control circuit 12 basically comprises an adjustable voltage divider circuit which provides the audio output terminal 22 with a predetermined percentage of the audio signal present at the terminal 15. This percentage is determined by the position of the wiper arm 21 and is substantially independent of the frequency of the signal at terminal 15.

The boost circuit 13 comprises a resistor 22 in parallel with a capacitor 23 coupled between the audio terminal 15 and the wiper arm 21 by a switch 24 having a contact arm 25 operable between an isolated terminal 26 and a terminal 27 connected to the resistor 22 and the capacitor 23. With the contact arm 25 connected between the wiper 21 and the terminal 27, the boost circuit 13 functions as a fixed treble frequency bypass for audio signals present at the input terminal 15. Thus in this position the audio frequency output terminal 22 receives a larger percentage of treble frequency audio signals. Also, the resistor 22 is connected in parallel with the portion of the resistive element of the potentiometer 20 between the wiper arm 21 and the audio input terminal 15. This increases the magnitude of the audio signal present at the output terminal 22 throughout the entire audio frequency range. Thus the moving of the contact arm 25 from the isolated terminal 26 to the terminal 27 results in selectively emphasizing the treble frequencies at the output terminal 22 while simultaneously substantially changing the magnitude of the audio signal present at terminal 22 throughout the entire audio frequency range. Thus the present invention has provided a single actuator arm switch means that simultaneously changes the magnitude of the audio output signal throughout the audio frequency range while additionally emphasizing the higher frequency components of the audio output signal.

FIG. 2 illustrates a control panel 30 having external and accessible mechanically adjustable controls which are designed to actuate the circuit shown in FIG. 1. A rotatable tone control knob 31 is illustrated for controlling the movement of the wiper arm 18 of the potentiometer 17. A rotatable volume control knob 32 is illustrated for controlling the position of the wiper arm 21. A slide switch 33 is illustrated as being operable between an off and an on position and is intended to control the movement of the contact arm 25 between the terminals 26 and 27, respectively. Thus the mechanical structure illustrated in FIG. 2, when used in conjunction with the electrical circuit shown in FIG. 1, provides a single actuator power-frequency control which has at least two predetermined set positions. This control provides a simple and effective tone control circuit which upon actuation will simultaneously increase the magnitude of the audio signal present at the terminal 22 throughout the audio frequency range while emphasizing selected (treble) portions of the audio frequency range.

FIG. 3 illustrates a typical audio signal amplitude versus frequency response 35 at terminal 22 before actuation of the booster circuit 13. Also illustrated is an amplitude versus frequency response 36 (shown dashed) which exists after the actuation of the booster circuit. The audio frequency range $f_1 - f_2$ is typically 50 to 10,000 Hz. Thus FIG. 3 shows that upon actuation of circuit 13 the magnitude of the entire frequency spectrum is substantially changed and selected portions of the spectrum are emphasized.

FIG. 4 illustrates a stereo volume, tone and balance control system 40. In system 40, a right channel audio input terminal 41 is coupled to a right channel audio output terminal 42 by a tone control circuit 43 (shown dashed), a volume control circuit 44 (shown dashed) and a boost circuit 45 (shown dashed). The circuits 43, 44 and 45 are identical to the respective circuits 11, 12 and 13 illustrated in FIG. 1 and form a control circuit identical to the control circuit 10. A left channel audio input terminal 51 is identically coupled to a left channel audio output terminal 52 by circuits 53, 54 and 55 which are identical to the circuits 43, 44 and 45, respectively. The wiper arms of the control circuits 43 and 53, the wiper arms of control circuits 44 and 54 and the contact arms of the boost switch circuits 45 and 55 are each illustrated as ganged together to form mechanically ganged right and left controls. The right audio output terminal 42 is coupled to the left audio output terminal 52 by the resistive element of a potentiometer 56 having an adjustable wiper arm 57 coupled directly to ground. The components 56 and 57 form a balance control circuit 58 (shown dashed) which provides an adjustable control for determining the relative strength of the audio signals present at the output terminals 42 and 52. The wiper arm 57 is intended to be positioned by a separate mechanically adjustable control knob which would be placed along side of the control knobs 31, 32 and 33 which are now contemplated as controlling the respective stereo tone, volume and booster circuits.

In the preferred embodiment of the present invention, the booster circuit is coupled between the wiper arm 21 and the audio input terminal 15. By placing the booster circuit in this position, its overall effect is substantially increased at low level settings of the volume control 12. As the volume control is turned up, the effect of the booster circuit is gradually minimized. This prevents any overwhelming burst of loud audio sound when the booster circuit 13 is actuated and the volume control circuit 12 is already set for a high audio signal level.

Thus the present invention has provided a simplified control system wherein a mechanically adjustable control having a single actuator element can be used to simply and conveniently accentuate certain portions of the audio frequency spectrum while simultaneously increasing the overall magnitude of the audio signal throughout the audio frequency spectrum. While I have shown and described specific embodiments of this invention, further modifications and improvements will occur to those skilled in the art. One such modification, for example, may consist of replacing the mechanically adjustable control elements 31, 32 and 33 with electronically adjustable control elements. All such modifications which retain the basic underlying principles disclosed and claimed herein are within the scope of this invention.

I claim:

1. An improved single control power-frequency control circuit especially adaptable for use in controlling an audio electrical signal in an automotive entertainment device, comprising:
   a first terminal for receiving an audio input signal throughout an audio frequency range,
   a second terminal, and
   an adjustable control means coupled between said first and second terminals for receiving said audio signal and providing a modified audio signal at said second terminal, said control means providing a single adjustment for selectively emphasizing certain frequencies within said audio frequency range in the modified audio signal while simultaneously substantially increasing the magnitude of the modified audio signal throughout the audio frequency range.

2. An improved control circuit according to claim 1 wherein said control means includes a mechanical actuator arm for providing a mechanically adjustable control circuit.

3. An improved control circuit adaptable for use in controlling an audio electrical signal in an automotive entertainment device, comprising:
   tone control means for selectively emphasizing certain frequencies within an audio frequency range in an audio signal,
   volume control means coupled to said tone control means for selectively determining the magnitude of said audio signal throughout the audio frequency range; and
   audio boost circuit means coupled to said volume control means for selectively emphasizing certain frequencies of said audio signal and simultaneously substantially increasing the magnitude of said audio signal throughout the audio frequency range.

4. An improved control circuit according to claim 3 wherein said tone control means includes a series resistor and a capacitor and a first mechanical means for varying the electrical magnitude of at least one of said resistor and capacitor.

5. An improved control circuit according to claim 4 wherein said tone control means comprises a potentiometer having a mechanically accessible and adjustable wiper arm.

6. An improved control circuit according to claim 5 wherein said volume control means comprises a potentiometer having a mechanically accessible and adjustable wiper arm.

7. An improved control circuit according to claim 6 wherein said boost circuit means comprises a switch, a resistor and a capacitor.

8. An improved control circuit according to claim 7 wherein said switch has at least two predetermined set positions.

9. An improved control circuit according to claim 7 wherein the resistor and capacitor in said boost circuit means are electrically coupled between the wiper arm of said volume potentiometer and one end of the resistive element thereof by said switch.

10. An improved control circuit according to claim 9 wherein said switch has at least two predetermined set positions and said volume and tone potentiometers are substantially continuously variable throughout their operative range.

11. An improved control circuit according to claim 9 wherein said booster circuit capacitor and resistor are coupled in parallel with each other.

12. An improved control circuit according to claim 11 wherein said tone control potentiometer has its wiper arm electrically coupled to one end thereof.

13. An improved control circuit according to claim 3 wherein said volume control means includes a potentiometer with a resistive element and a mechanically accessible and adjustable wiper arm and wherein said boost circuit means includes resistive means and capacitive means coupled in parallel to each other, said boost circuit means also including a switch means and said switch means selectively coupling said parallel coupled resistive and capacitive means between said volume control means wiper arm and one end of said volume control means resistive element.

14. An improved control circuit according to claim 13 wherein said tone control means includes a resistor means coupled in series with a capacitor means, at least one of said resistor and capacitor means being variable, said series coupled resistor and capacitor means being coupled in parallel with said volume control means resistive element.

* * * * *